US005719753A

United States Patent [19]

Taylor

[11] Patent Number: 5,719,753

[45] Date of Patent: Feb. 17, 1998

[54] CIRCUIT BOARD ASSEMBLY

[75] Inventor: Robert William Taylor, Surrey, Great Britain

[73] Assignee: Cliff Electronic Components Limited, Surrey, Great Britain

[21] Appl. No.: 597,286

[22] Filed: Feb. 2, 1996

[30] Foreign Application Priority Data

Feb. 3, 1995 [GB] United Kingdom .................. 9502161

[51] Int. Cl.$^6$ .................................................. H05K 1/04

[52] U.S. Cl. ........................ 361/812; 361/753; 361/823; 439/78

[58] Field of Search ............................. 439/78, 83, 709; 361/752, 753, 758–760, 772–775, 796, 799, 807, 809, 810, 812, 816, 818, 823, 825

[56] References Cited

U.S. PATENT DOCUMENTS

| | | | |
|---|---|---|---|
| 3,624,588 | 11/1971 | Farmer | 339/17 C |
| 4,570,338 | 2/1986 | Ignatowicz | 29/845 |
| 4,591,950 | 5/1986 | Houpt | 361/399 |
| 4,776,706 | 10/1988 | Loiterman | 374/208 |
| 4,841,414 | 6/1989 | Hibino | 361/823 |
| 4,924,213 | 5/1990 | Decho | 340/653 |
| 5,079,671 | 1/1992 | Garrett | 361/825 |
| 5,291,376 | 3/1994 | Mills | 361/823 |
| 5,526,235 | 6/1996 | Beason | 361/799 |

*Primary Examiner*—Gerald P. Tolin

*Attorney, Agent, or Firm*—McCormick, Paulding & Huber

[57] ABSTRACT

A circuit board assembly and a method of manufacturing such an assembly has a circuit board 1 with spaced holes 6 which receive projections 15 of a rigid metal chassis 11 which is part of a sub-assembly 10. The projections 15 are soldered in the holes 6 to rigidly secure the sub-assembly to the circuit board. The sub-assembly 10 has a pair of terminal posts 18 from which extend electrical connections 25, 26 having ends formed as fingers 30, 31. The fingers 30 and 31 are received in sets of corresponding holes 8 and 7 respectively in the circuit board and soldered in their respective holes to provide an electrical connection between the strips 25 and 26 and circuit lines 5 and 4 respectively on the circuit board. The soldered joints between the projections 15 and the circuit board permits torque applied to the terminal posts 18 to be accommodated by the circuit board assembly.

14 Claims, 2 Drawing Sheets

CIRCUIT BOARD ASSEMBLY

TECHNICAL FIELD & BACKGROUND ART

The present invention relates to a circuit board assembly and a method of manufacturing such an assembly. Electrical circuit beards typically have a rigid base board or sheet of insulating material (such as resin bonded epoxy glass or paper) on a face of which is formed a pattern or grid of copper lines which provide electrical conduits set out in predetermined circuit configurations. The copper lines are overlaid by an insulating material (such as a resin coating) other than at predetermined positions where electrical connections are to be made to those lines. At these positions it is usual for apertures to be provided in the board and a flux applied to the copper so that electrical connections (such as wires received through the apertures) can be soldered to extend from an appropriate circuit of the board. The soldering can be manual but usually, for mass production purposes, automatic flow solderwave techniques are employed.

With known circuit boards of the kind discussed above, it is also known to provide a circuit board assembly where terminals (such as jack sockets or plugs) are mounted on the face of the board opposite to that carrying the circuit lines with electrical wire connections from the terminals being received in apertures in the board and soldered thereto for the electrical connections to join with appropriate circuit lines of the board. This soldering of the wire connections to the circuit lines also provides a convenient means of coupling the jack socket or plug terminals on the board. Jack sockets and plugs conventionally have plastics moulded bodies and occasionally these bodies are provided with integral studs which are received in apertures in the board remote from the apertures which receive the electrical connections. The co-operation between the studs and apertures provides a convenient means of locating the plastics body on the circuit board during the soldering of the electrical connections. The soldered joints between electrical connections of a jack socket or plug and circuit lines of a circuit board may be adequate to retain the terminal against being dislodged from the circuit board under the thrust to which the terminal is subjected during the fitting of a jack plug or socket (where the thrust from an electrical coupling that is made to the terminal is applied axially, usually in a plane parallel to the circuit board). However experience has shown that the aforementioned soldered electrical connections are inadequate to alleviate the likelihood of the terminals on the board from becoming dislodged and breaking their electrical joints with the circuit lines in response to the application of large torques on the terminals. This may particularly be the case with a terminal post where a threaded knob or the like is screw adjusted to clamp a wire and the torque applied during such screw adjustment may be sufficiently high to cause the terminal to break away from the circuit board. As a consequence terminals which may be subjected to large torque forces during their operation (as in the example of a terminal post as aforementioned) are conventionally mounted on a rigid housing or frame within which the circuit board may be received and such terminal connected by a flexible wire that is soldered into the circuit board. This latter technique of connection is disadvantageous in so far as it is frequently regarded as an inconvenient and time consuming operation which often has to be effected manually and therefore considered a relatively expensive technique in commercial manufacture—it is An object of the present invention to provide a circuit board assembly and a method of manufacturing such an assembly which alleviates the aforementioned disadvantage.

STATEMENTS OF INVENTION & ADVANTAGES

According to the present invention there is provided a circuit board assembly of a circuit board and a sub-assembly, the sub-assembly comprising a substantially rigid chassis on which an electrical terminal is firmly secured, the chassis having a mounting projection and the terminal having an electrical connection, said projection and electrical connection being received in separate apertures in the circuit board and soldered therein to electrically connect the electrical connection in a circuit of the circuit board and to rigidly secure the chassis to the circuit board.

Further according to the present invention there is provided a method of manufacturing a circuit board assembly which comprises forming a sub-assembly of an electrical terminal firmly secured to a rigid chassis with an electrical connection extending from the terminal and a mounting projection extending from the chassis; providing apertures in a circuit board; locating the electrical connection and mounting projection in separate apertures in the circuit board, and soldering the electrical connection and mounting projection in their respective apertures to rigidly secure the chassis to the circuit board and to electrically connect the electrical connection in a circuit of the circuit board.

Preferably the electrical terminal is rigidly secured to the chassis and preferably has a torque operable part, for example as with a terminal post in which a knob threadedly engages with a post of the terminal so that screw adjustment of the knob serves to clamp an electrical wire that is connected to the post or as with a screw or bayonet fitting cap which is adjustable by torque on the terminal for the purpose of retaining or locking a particular component on that terminal. With such a terminal having a torque operable part rigidly secured to the chassis of the sub-assembly, adjustment of the terminal to impart torque to the chassis will result in that torque reacting on the circuit board predominantly through the soldered in mounting projection of the chassis. The soldered connection between the chassis and the circuit board should be adequate to ensure that the sub-assembly is capable of withstanding the torque to which it is likely to be subjected, reasonably, in use without breaking away from the circuit board. By rigidly securing the substantially rigid chassis to the circuit board in the manner of the present invention, it may be possible for the circuit board assembly to be located within a housing of a particular electrical unit so that the terminal of the sub-assembly is located (say in a window of a facia panel of the housing) for an electrical connection to be made thereto without the necessity of the terminal of the sub-assembly being secured to the facia panel or elsewhere other than to the circuit board in the manner of the present invention.

The soldering of the mounting projection in its aperture in the circuit board may be effected substantially simultaneously with the soldering of the electrical connection from the terminal of the sub-assembly in its aperture in the circuit board to a required circuit line of that board.

The chassis is preferably formed of sheet metal with the mounting projection extending therefrom, such projection usually being presented by a finger extending on the chassis. In fact it is likely that the chassis of the sub-assembly will have a spaced array of two or more mounting projections which are substantially co-planar and are received and soldered in separate apertures in a flat circuit board. The chassis soldered to the circuit board consequently protects the soldered electrical connection in the circuit board from being broken in response to torque forces applied to the chassis (particularly when those torque forces are applied to the chassis to react in a sense to lift the electrical connection and one or more of the mounting projections from the plane of the circuit board).

The chassis of the sub-assembly may have two or more electrical terminals firmly secured thereto, each such terminal having an electrical connection with ends of the electrical connections from the terminals of the sub-assembly being disposed in a substantially co-planar spaced array and soldered in separate apertures in the circuit board for electrical connection to a circuit line or respective circuit lines of a flat circuit board. The electrical connection of the or an electrical terminal of the sub-assembly is preferably provided by a metal strip which is relatively rigid on the sub-assembly to facilitate location of an end of the strip within the aperture for soldering to the circuit board. It is also preferred that the end of the electrical connector which is soldered to the circuit board is formed to present at least two fingers which are received in separate apertures in the circuit board and soldered in their respective apertures for electrical connection to a common circuit line of the circuit board. By forming the end of a metal strip-like electrical connector to present two or more fingers, each finger may be received and soldered in a separate small circular hole which is easily drilled or otherwise formed in the circuit board; this alleviates the necessity of forming either an elongated slot-like aperture in the circuit board to accommodate the full width of a metal strip connector or of forming a relatively large diameter circular hole to accommodate such a full width connector strip. Furthermore, by providing the two or more fingers at the end of an electrical connector from a terminal and soldering those fingers in individual apertures in the circuit board, the electrical connector can connect with a circuit of the board through a relatively large aggregate cross-sectional area (thereby permitting the connector to carry a substantial electrical current through the multiple electrical contact points of the fingers with the circuit board).

The chassis of the sub-assembly may comprise a plate or frame part extending substantially parallel with the plane of the circuit board and on which one or more electrical terminals are firmly secured to be presented for an electrical coupling to be made thereto in a direction which extends substantially perpendicularly to the plane of the circuit board. As a further possibility the chassis may have a plate or frame part extending substantially perpendicularly to the plane of the circuit board and on which one or more electrical terminals are firmly secured to be presented for an electrical coupling to be made thereto in a direction substantially parallel to the plane of the circuit board.

In manufacture of the circuit board assembly of the present invention, the or each mounting projection and electrical connection of the sub-assembly may be soldered manually and individually in their respective apertures on the circuit board or may be soldered automatically, for example by use of a conventional flow solder wave technique.

DRAWINGS

One embodiment of a circuit board assembly constructed in accordance with the present invention will now be described, by way of example only, with reference to the accompanying illustrative drawings, in which:

FIG. 1 is a perspective view showing a sub-assembly and circuit board preparatory to being fitted together in the manufacture of the circuit board assembly, and FIG. 2 shows, in part section, a modification of the circuit board assembly in which a terminal of the sub-assembly is presented in a different orientation relative to the circuit board from that shown in FIG. 1.

DETAILED DESCRIPTION OF DRAWINGS

Figure 1:
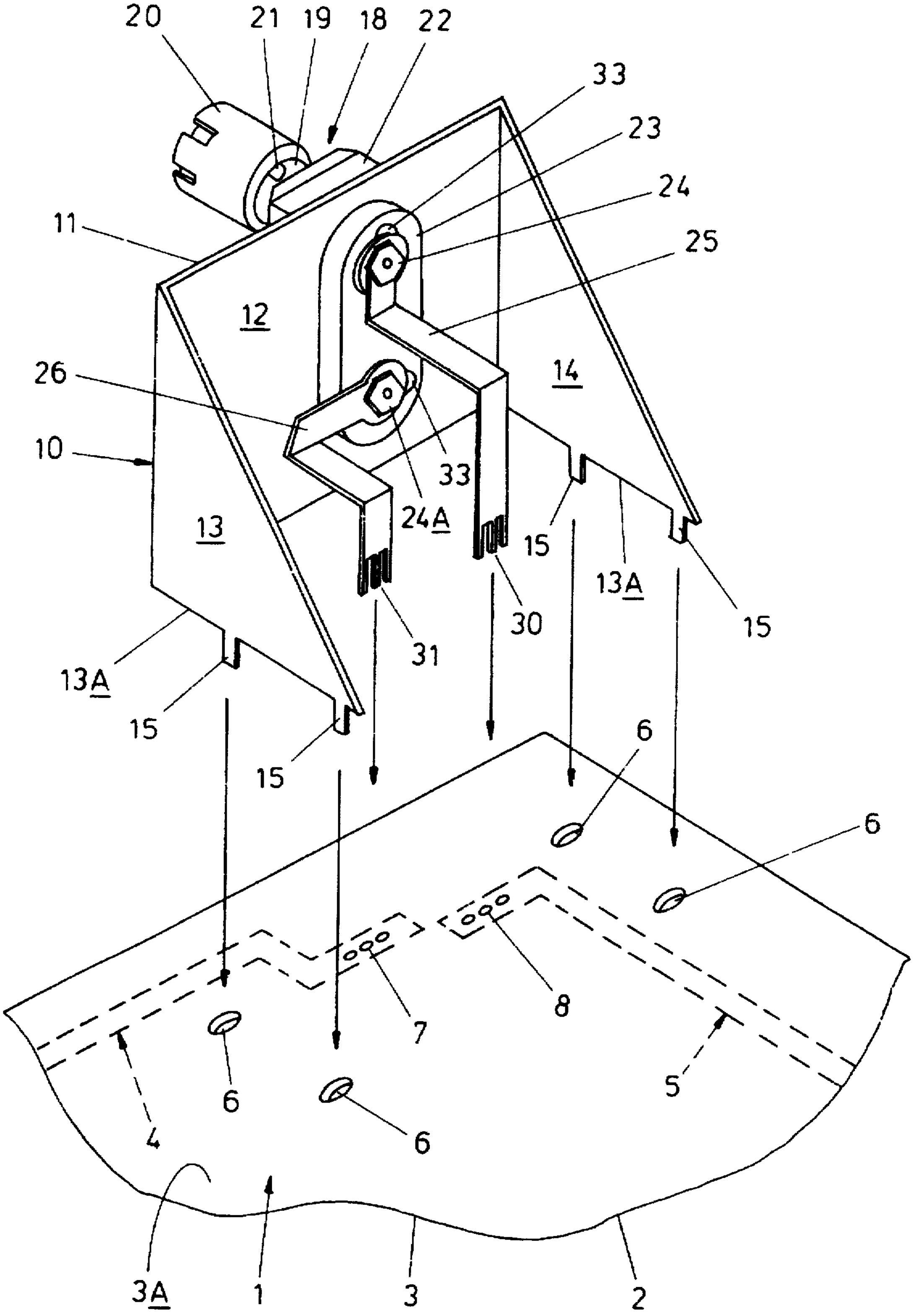

The circuit board assembly includes a flat circuit board 1 which may conveniently be regarded as being of conventional structure having a relatively rigid carrier sheet 2 of insulating material (such as resin bonded epoxy glass) on the underface 3 (as seen in FIG. 1) of which is printed an electrically conductive circuit pattern of copper lines, in the present example, two separate circuit lines 4 and 5 are indicated. The copper lines 4 and 5 have a protective resin coating (not shown). Extending through the circuit board remote from the circuit lines 4 and 5 are four spaced circular holes 6. Also extending through the circuit board 1 is a set of three small, closely adjacent and linearly arranged circular holes 7 which are located to communicate with the circuit line 4 and a similar set of three small closely adjacent and linearly arranged circular holes 8 which are located to communicate with the circuit line 5.

The circuit board assembly is formed by the combination of the circuit board 1 with a sub-assembly 10 which comprises a relatively rigid sheet metal chassis 11 formed to present a front plate 12 and opposed side plates 13 and 14. Extending from straight bottom edges 13A of the side plates 13 and 14 are four finger-like projections 15 that are integral with the chassis 10 and are positioned to correspond in their array with the array of holes 6 in the circuit board.

Rigidly mounted on and secured to the front plate 12 of the chassis is a twin terminal post assembly 18. The terminal post assembly is conveniently of conventional structure comprising an electrically conductive rod 19 over which is screw threadedly displaceable a castellated insulated knob 20 to open or close a hole 21 in the rod within which hole 21 may be received an electrical connecting wire so that such wire is clamped by the knob 20 to provide an electrical coupling to the rod. The rod 19 extends through an aperture in the front plate 12 and is carried by opposed plastics insulating plates 22 and 23 which sandwich the plate 12 of the chassis. The terminal post assembly 18 is secured and retained on the chassis by nuts 24 which threadedly engage with the rod 19 to clamp the chassis plate 12 between the insulating plates 22 and 23. In FIG. 1 only an upper terminal post has been illustrated, it being appreciated that a second, lower, terminal post will be constructed similarly to the upper post and the conductive rod of such second post is secured by nuts 24A. Secured by the nut 24 to the conductive rod 19 of the upper terminal post is a relatively rigid strip metal electrical connection 25. Similarly connected by the nut 24 to the conductive rod of the lower terminal of the assembly 18 is a relatively rigid strip metal electrical connection 26. The end of the connection 25 remote from the nut 24 is formed as three linearly spaced strip-like fingers 30. Similarly the end of the connection 26 remote from the nut 24A is formed with three linearly spaced strip-like fingers 31. The projections 15 and fingers 30 and 31 are substantially co-planar and the metal strip connections 25 and 26 are configured so that with the projections 15 corresponding with the holes 6, the fingers 30 correspond one with each of the holes in the set 8 and the fingers 31 correspond one with each of the holes in the set 7. To maintain the required positions of the fingers 30 and 31 relative to the chassis 11 by alleviating rotation of the connections 25 and 26 on the respective conductive rods 19, the ends of the connectors 25 and 26 adjacent to the retaining nuts 24, 24A are provided with rigid tags 33 that are received in complementary shaped recesses in the insulating plate 23.

The sub-assembly 10 is presented to the upper face 3A of the circuit board 1 and fitted thereto so that the projections 15 are received one each in the holes 6 as the three fingers 30 are received, one each, in the holes of the set 8 and the three fingers 31 are received, one each, in the holes of the set 7. Following this fitting and location of the sub-assembly on the circuit board (preferably with the bottom edges 13A of the chassis seated stably on the upper face 3A of the board), the projections 15, 30 and 31 are soldered to the circuit board in the holes within which they are respectively received. During such soldering the sub-assembly 10 may be retained on the circuit board by a temporary jig or otherwise. To facilitate the soldering operation a flux will usually be applied about the holes in the circuit board. To improve bonding of the solder with the circuit board at parts adjacent to the holes 6, such parts of the circuit board (remote from the circuit lines 4 and 5) may have localised regions of copper printed on the carrier sheet 2—this should not present any problem since the circuit board 1 will usually be manufactured to predetermined characteristics. The aforementioned soldering may be effected manually or by use of a known solder flow wave techniques.

The soldering of the fingers 30 in the holes of the set 8 and of the fingers 31 in the holes of the set 7 provides a good electrical connection between the metal strip connector 25 and the circuit line 5 and between the metal strip connector 26 and the circuit line 4. The soldering of the projections 15 in the respective holes 6 rigidly retains or anchors the chassis 11 to the circuit board. To improve the aforementioned anchorage, the projections 15 may be kinked or dog-legged within the solder as indicated at 15B in FIG. 2. The soldering of the fingers 30 and 31 within the set of holes 8 and 7 respectively will additionally serve to retain the sub-assembly 10 firmly on the circuit board.

It will be seen from FIG. 1 that by forming the ends 30 and 31 of the connection strips into the fingers, each such finger can be received in a relatively small diameter circular hole in the set 7 or 8 in the circuit board—this avoids the necessity of either having an unreasonably large diameter circular hole to accommodate the whole width of the strip connector 25 or 26 or the inconvenience of machining narrow slots in the circuit board to accept the full width of the metal strips 25 and 26 (it being appreciated that, usually, it is far more convenient and less expensive to machine circular holes in a circuit board than slots!).

Furthermore, the array of fingers at the end of each strip connection 25 and 26 provides multiple point electrical connections with the respective circuit line 5 or 4 respectively of the circuit board. Consequently a relatively large aggregate cross-sectional area of the fingers of the strips 25 and 26 can be maintained in electrically conductive communication with the respective circuit lines on the board to permit relatively large currents to flow from the circuit board to the metal strip connectors 25 and 26. To illustrate the advantages of having such an arrangement of fingers 30, 31 and holes 7, 8 in which the fingers are soldered, if for example it is necessary for the strip connector 25 or 26 to carry say 30 amps, the cross section of the strip 25 or 26 would conventionally be at least 6 mm square where it is soldered into the circuit board. A connector 25, 26 of such a large cross section presented in conventional form as a single rectangle or circle would have to be received in a correspondingly large hole in the circuit board. As a consequence of the large amount of metal in the conductor, it would be extremely difficult to solder-in the large conductor to the circuit board by flow soldering techniques. The reason for this is that the large conductor conducts the heat of soldering rapidly away from the soldering site and insufficient heat gets into the site to produce an efficient soldered connection (typically a so-called "dry joint" results). By providing the fingers 30, 31 and hole 7, 8 in which the fingers are respectively soldered, the aggregate cross sectional area of all of the fingers 30 or 31 at the end of a strip connector can be made to exceed, for example, 6 mm square for the 30 amp usage whilst each finger is of relatively small cross sectional area so that it can easily and efficiently be soldered into a discrete small hole 7 of 8 by flow soldering techniques.

It will be appreciated that in the assembly manufactured from the arrangement shown in FIG. 1, the terminal posts of the assembly 18 are carried by the chassis 11 to be presented for access in a direction which is substantially parallel with the plane of the circuit board. The anchorage for the sub-assembly 10 which is provided by the soldered-in projections 15, ensures that the terminal posts will be relatively rigid with the circuit board 1 and as such may be presented for use whilst the sub-assembly 10 is unsupported other than for its connection with the circuit board 1.

During use of the terminal posts in the assembly 18 and as the insulated knobs 20 are screw threadedly adjusted either to clamp or unclamp a wire in the aperture 21, it will be appreciated that a torque will be applied to the insulated plates 22 and 23 and therethrough to the chassis 11 in a direction perpendicular to the plane of the circuit board. This torque (which may be considerable, particularly if applied by a tool) predominantly reacts through the chassis 11 to the circuit board 1 by way of the soldered-in projections 15 to lift one or more of the projections 15 from the plane of the upper face of the circuit board. However the anchorage provided at these soldered projections should be adequate to alleviate the likelihood of the sub-assembly 10 from being torn away from the circuit board in response to the application of a torque, which may reasonably be expected, to the terminal posts. The chassis soldered to the circuit board thus protects the electrical connections at 7/31 and 8/30 from being broken during the tightening or loosening of the knobs 20.

Figure 2:
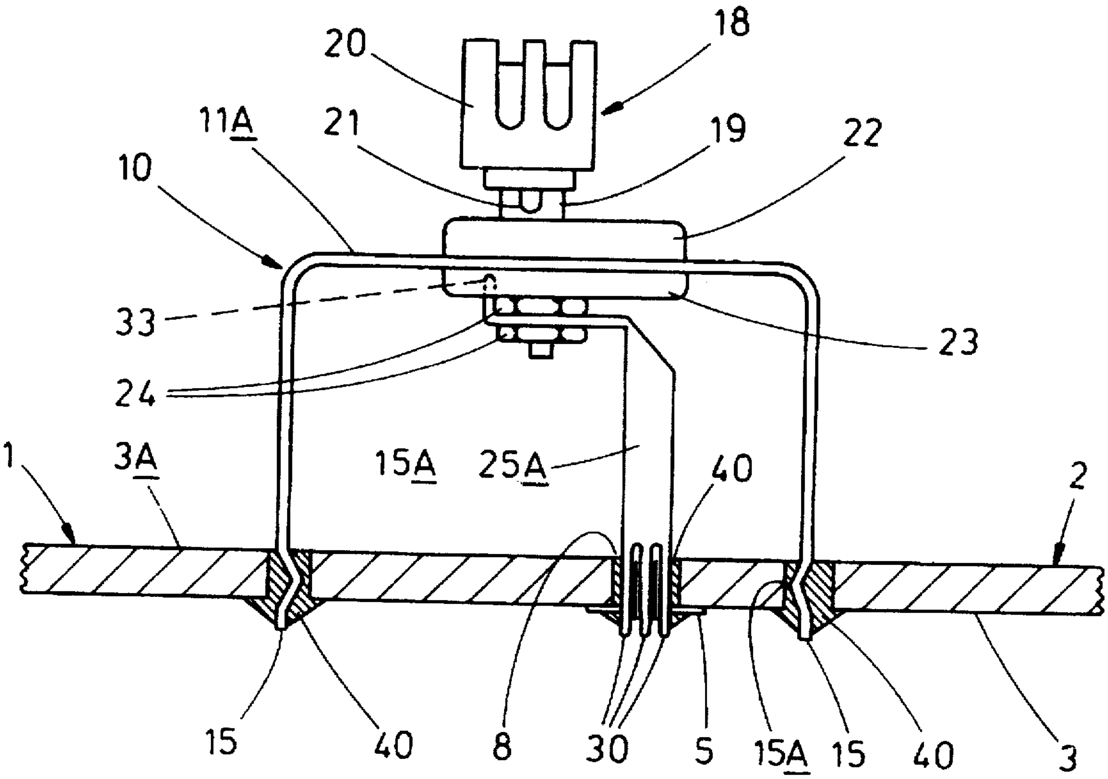

In FIG. 2, the sub-assembly 10 has a sheet metal chassis 11A, the configuration of which is modified from the chassis shown in FIG. 1 so that the terminal post assembly 18 is mounted for its terminals to be presented in a direction which is substantially perpendicular to the plane of the circuit board 1. It will be appreciated that with this configuration the shape of the metal strip connectors 25 and 26 will have to be modified to locate the fingers 30 and 31 so that they can be received in the sets of holes 8 and 7 respectively (as indicated by the fingers 30 of the strip 25A co-operating with the holes 8). In FIG. 2 the solder for the joints is indicated at 40 and it will be noted that the projections 15 of the chassis 11A are kinked at 15A within the body of the solder to ensure a firm anchorage.

I claim:

1. A circuit board assembly of a circuit board and a sub-assembly, the sub-assembly comprising a substantially rigid chassis on which an electrical terminal is firmly secured, the chassis having a mounting projection and the terminal having an electrical connection, said projection and electrical connection being received in separate apertures in the circuit board and soldered therein to electrically connect the electrical connection in a circuit of the circuit board and to rigidly secure the chassis to the circuit board, the electrical terminal being electrically isolated from the chassis, wherein the electrical terminal secured to the chassis has a torque-operable part, operation of which imparts torque to the chassis, said torque reacting on the circuit board substantially through the mounting projection soldered in the circuit board.

2. An assembly as claimed in claim 1 in which the electrical terminal is rigidly secured to the chassis.

3. An assembly as claimed in claim 1 in which the chassis is formed of sheet metal.

4. An assembly as claimed in claim 1 in which the mounting projection is presented by a finger extending on the chassis.

5. An assembly as claimed in claim 1 in which the chassis has a spaced array of at least two mounting projections which are substantially coplanar and are received and soldered in separate apertures in the circuit board.

6. An assembly as claimed in claim 1 in which the chassis has at least two electrical terminals firmly secured thereto, each such terminal having an electrical connection and ends of the electrical connections from the terminals being disposed in a substantially coplanar spaced array and soldered in separate apertures in the circuit board for electrical connection to a circuit line or respective circuit lines of the circuit board.

7. An assembly as claimed in claim 1 in which the electrical connection of the electrical terminal is provided by a metal strip which is substantially rigid on the sub-assembly.

8. An assembly as claimed in claim 1 in which the end of the electrical connection which is soldered to the circuit board presents at least two fingers which are received in separate apertures in the circuit board and soldered in their respective apertures for electrical connection to a common circuit line of the circuit board.

9. An assembly as claimed in claim 8 in which the apertures in which the fingers of the electrical connection are respectively received are circular.

10. An assembly as claimed in claim 1 in which the chassis comprises a plate or frame part extending substantially parallel with the plane of the circuit board and on which at least one electrical terminal is firmly secured to be presented in a direction which extends substantially perpendicularly to the plane of the circuit board.

11. An assembly as claimed in claim 1 in which the chassis has a plate or frame part extending substantially perpendicularly to the plane of the circuit board and on which at least one electrical terminal is firmly secured to be presented in a direction substantially parallel to the plane of the circuit board.

12. An assembly as claimed in claim 1 in which the electrical terminal is a terminal post and said torque-operable part is a screw threadably adjustable knob of said terminal post.

13. An assembly as claimed in claim 1 in which the or a mounting projection has a kinked or dog-legged profile to anchor that projection within the solder by which it is rigidly secured to the circuit board.

14. A circuit board assembly comprising a circuit board; a sub-assembly of a substantially rigid chassis and an electrical terminal firmly secured to said chassis; said chassis having an array of at least two mounting projections which are received in apertures in the circuit board and soldered therein to connect and rigidly secure the sub-assembly on a face of the circuit board; said electrical terminal having an electrical strip connection which is received in aperture means in the circuit board and soldered therein to electrically connect the strip connection in a circuit of the circuit board; said electrical terminal comprising screw threaded means which is screw threadedly adjustable for movement in a plane substantially parallel to said face of the circuit board, and wherein said screw threaded adjustment provides a torque which reacts through the chassis into the soldered connections between the mounting projections of the chassis and the circuit board in a sense for lifting at least one of the mounting projections from said face of the circuit board and said soldered connections between the mounting projections and the circuit board alleviate forces being applied from said torque on to the soldered connection between the electrical connection and the circuit board in a sense to break said soldered connection of the electrical connection.

* * * * *